（12） United States Patent  
Yabuuchi et al.

(10) Patent No.: US 9,148,115 B2  
(45) Date of Patent: Sep. 29, 2015

(54) FILTER AND DUPLEXER

(71) Applicant: TAIYO YUDEN CO., LTD., Tokyo (JP)

(72) Inventors: Naoya Yabuuchi, Kanagawa (JP); Toshio Nishizawa, Kanagawa (JP); Hikaru Shimomura, Kanagawa (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 190 days.

(21) Appl. No.: 13/909,868

(22) Filed: Jun. 4, 2013

(65) Prior Publication Data

US 2013/0328639 A1   Dec. 12, 2013

(30) Foreign Application Priority Data

Jun. 12, 2012  (JP) ................... 2012-132627

(51) Int. Cl.
| | |
|---|---|
| H03H 9/02 | (2006.01) |
| H03H 9/72 | (2006.01) |
| H03H 9/00 | (2006.01) |
| H03H 9/70 | (2006.01) |
| H03H 9/46 | (2006.01) |

(52) U.S. Cl.  
CPC ........... *H03H 9/0004* (2013.01); *H03H 9/0023* (2013.01); *H03H 9/46* (2013.01); *H03H 9/70* (2013.01); *H03H 9/725* (2013.01)

(58) Field of Classification Search  
CPC ..... H03H 9/0004; H03H 9/70; H03H 9/0023; H03H 9/46  
USPC ............ 455/78; 333/133, 129, 132, 195, 175, 333/193, 32, 173  
See application file for complete search history.

(56) References Cited

U.S. PATENT DOCUMENTS

| | | | | |
|---|---|---|---|---|
| 6,489,861 | B2 * | 12/2002 | Noguchi et al. | 333/133 |
| 7,135,944 | B2 * | 11/2006 | Iwamoto et al. | 333/133 |
| 7,155,178 | B2 * | 12/2006 | Chang et al. | 455/101 |
| 7,612,634 | B2 * | 11/2009 | Iwata | 333/133 |
| 2005/0206478 | A1 * | 9/2005 | Satoh et al. | 333/133 |
| 2007/0035362 | A1 | 2/2007 | Uejima et al. | |

FOREIGN PATENT DOCUMENTS

JP   2008-263624 A   10/2008

* cited by examiner

*Primary Examiner* — Dinh Le  
(74) *Attorney, Agent, or Firm* — Chen Yoshimura LLP

(57) ABSTRACT

A filter includes: a filter circuit connected between a first terminal and a second terminal; and a matching circuit connected between the filter circuit and the second terminal, wherein an impedance viewed from the second terminal toward the matching circuit is less than an impedance viewed from a node between the filter circuit and the matching circuit toward the filter circuit.

8 Claims, 16 Drawing Sheets

FILTER AND DUPLEXER

CROSS-REFERENCE TO RELATED APPLICATION

This application is based upon and claims the benefit of priority of the prior Japanese Patent Application No. 2012-132627, filed on Jun. 12, 2012, the entire contents of which are incorporated herein by reference.

FIELD

A certain aspect of the present invention relates to a filter and a duplexer.

BACKGROUND

A high-frequency circuit of a wireless terminal such as a mobile phone includes a duplexer including a transmission filter and a reception filter coupled to a common antenna terminal. Used for each filter is an acoustic wave filter using an acoustic wave such as a surface acoustic wave (SAW), a bulk acoustic wave (BAW), a LOVE wave, a boundary wave, or a Lamb wave (e.g. Japanese Patent Application Publication No. 2008-263624).

Multi-functionalized and sophisticated wireless terminals require a filter and a duplexer having good characteristics (low-loss, wide bandwidth).

SUMMARY OF THE INVENTION

According to an aspect of the present invention, there is provided a filter including: a filter circuit connected between a first terminal and a second terminal; and a matching circuit connected between the filter circuit and the second terminal, wherein an impedance viewed from the second terminal toward the matching circuit is less than an impedance viewed from a node between the filter circuit and the matching circuit toward the filter circuit.

According to another aspect of the present invention, there is provided a duplexer including: the above described filter.

DETAILED DESCRIPTION

First Embodiment

Figure 1:
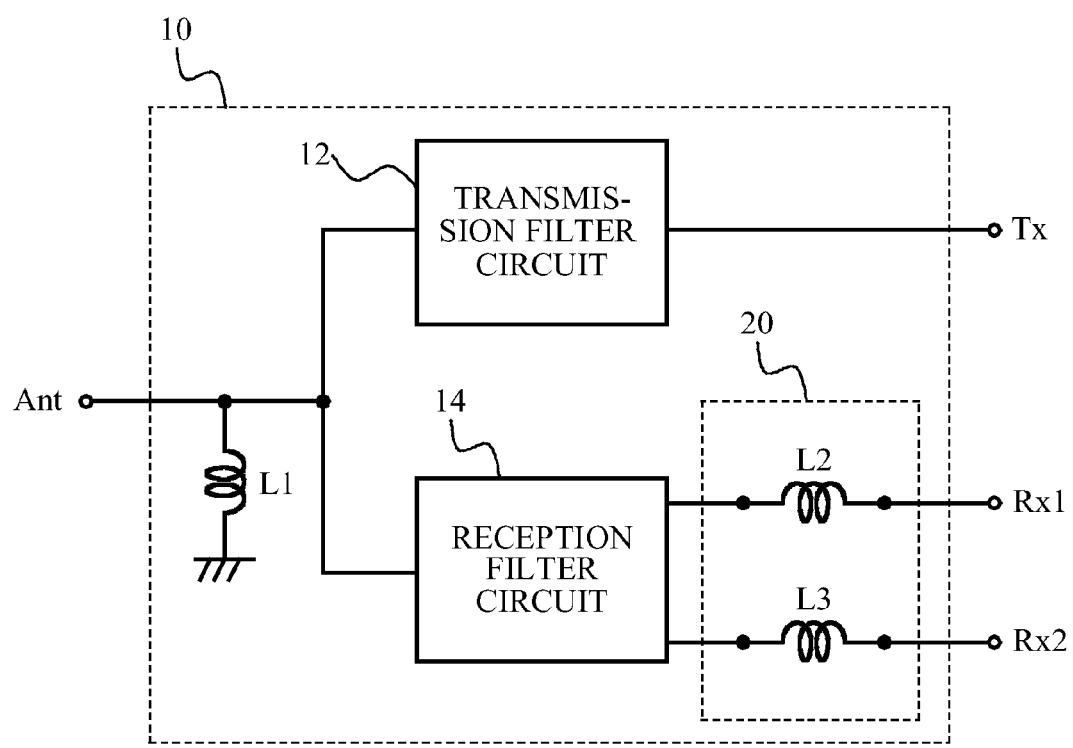
FIG. 1 is a diagram illustrating a configuration of a duplexer in accordance with a first embodiment.

FIG. 1 is a diagram illustrating a configuration of a duplexer in accordance with a first embodiment. A duplexer 10 is coupled to an antenna terminal Ant, a transmission terminal Tx, and two reception terminals (Rx1, Rx2). The duplexer 10 includes a transmission filter circuit 12 connected between the antenna terminal Ant and the transmission terminal Tx1 and a reception filter circuit 14 connected between the antenna terminal Ant and the reception terminals (Rx1, Rx2). The transmission filter circuit 12 and the reception filter circuit 14 share the antenna terminal Ant. The reception filter circuit 14 is a balance circuit coupled to two balanced output terminals (Rx1, Rx2).

The duplexer 10 further includes a matching circuit 20 connected between the reception filter circuit 14 and the reception terminals (Rx1, Rx2) and an inductor L1 connected between the antenna terminal Ant and a ground. The L1 is a matching inductor located at a side of the antenna terminal Ant. The matching circuit 20 includes an inductor L2 connected between the reception filter circuit 14 and the reception terminal Rx1 and an inductor L3 connected between the reception filter circuit 14 and the reception terminal Rx2. The first embodiment configures the inductors (L2, L3) in the matching circuit 20 to be directly coupled to the reception terminals (Rx1, Rx2).

Figure 2:
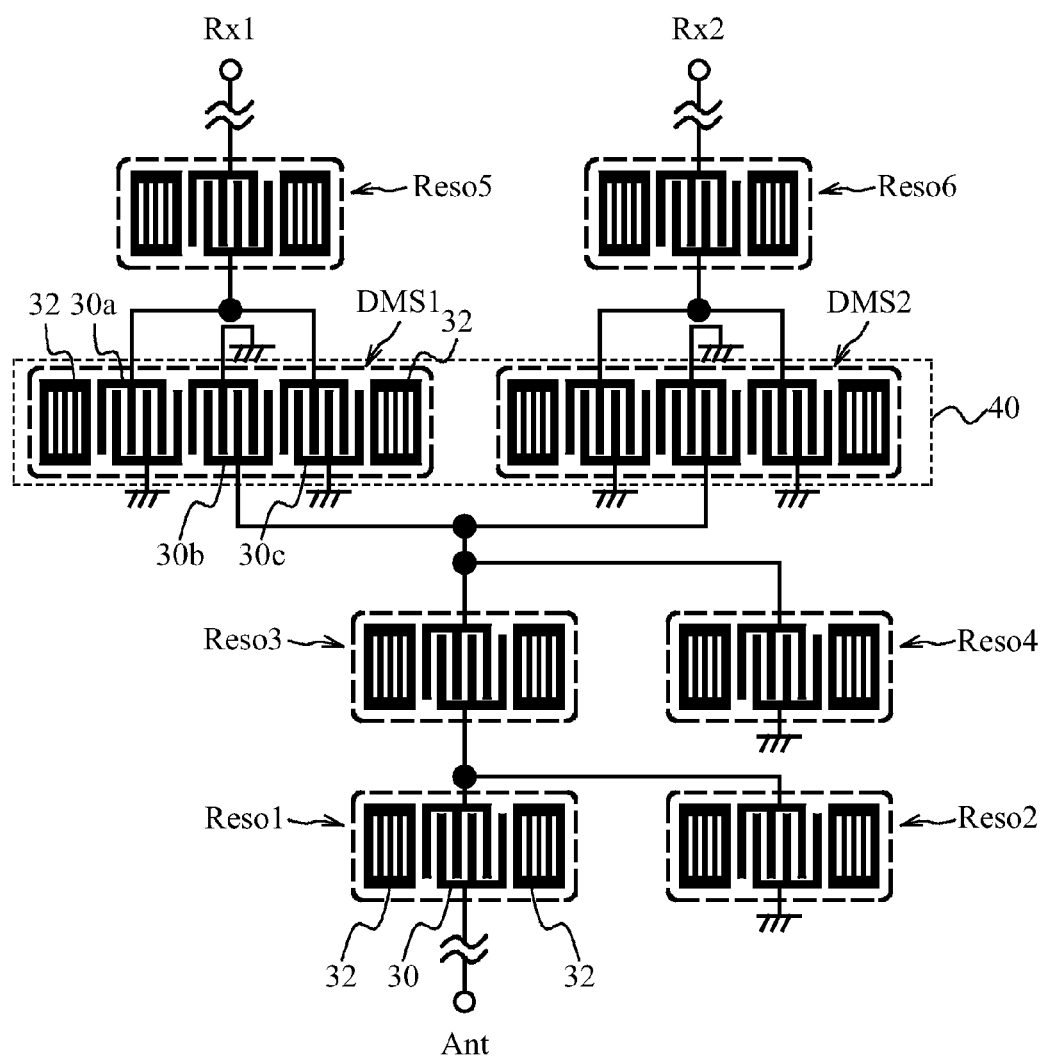
FIG. 2 is a diagram illustrating a configuration of a reception filter circuit.

FIG. 2 is a diagram illustrating a detailed configuration of the reception filter circuit 14. The reception filter circuit 14 is configured so that a DMS portion 40 including a DMS1 and a DMS2 that are double mode SAW filters is located between resonators Reso1 through Reso6 arranged in a ladder form. More specifically, the series resonators Reso1 and Reso3 are connected in series in this order from a side closer to a signal path from the antenna terminal Ant. The signal path is divided into two after passing through the Reso3, and the DMS1 of the double mode SAW filters is coupled to a first path of the divided signal paths and the DMS2 is coupled to a second path. The DMS1 is coupled to the reception terminal Rx1 through the series resonator Reso5, and the DMS2 is coupled to the reception terminal Rx2 through the series resonator Reso6. The parallel resonator Reso2 is connected between a node between the Reso1 and the Reso3 and a ground, and the parallel resonator Reso4 is connected between a node between the Reso3 and the DMS portion 40 (DMS1, DMS2) and a ground.

The resonators Reso1 through Reso6 are SAW resonators, and each of them includes an IDT (Interdigital Transducer) 30 and two reflection electrodes 32 located at both sides thereof. The DMS1 and DMS2 are double mode SAW filters, and each of them includes three IDTs 30a through 30c arranged in a propagation direction of a surface acoustic wave and two reflection electrodes 32 located at both sides thereof. In the DMS1, the IDT 30b located at the center is coupled to the Reso3 at the antenna terminal Ant side, and the IDTs 30a and 30c are coupled to the Reso5 at the reception terminal Rx1 side. In the DMS2, the IDT at the center is coupled to the Reso3 at the antenna terminal Ant side, and other IDTs are coupled to the Reso6 at the reception terminal Rx2 side.

In the first embodiment, the resonators Reso1 through Reso6 are SAW resonators, but the resonators Reso1 through Reso6 may be resonators by other acoustic wave devices (e.g. piezoelectric thin film resonator). Moreover, the Reso1 through Reso6 may be omitted, and the resonators may be divided into arbitrary numbers.

Figure 3:
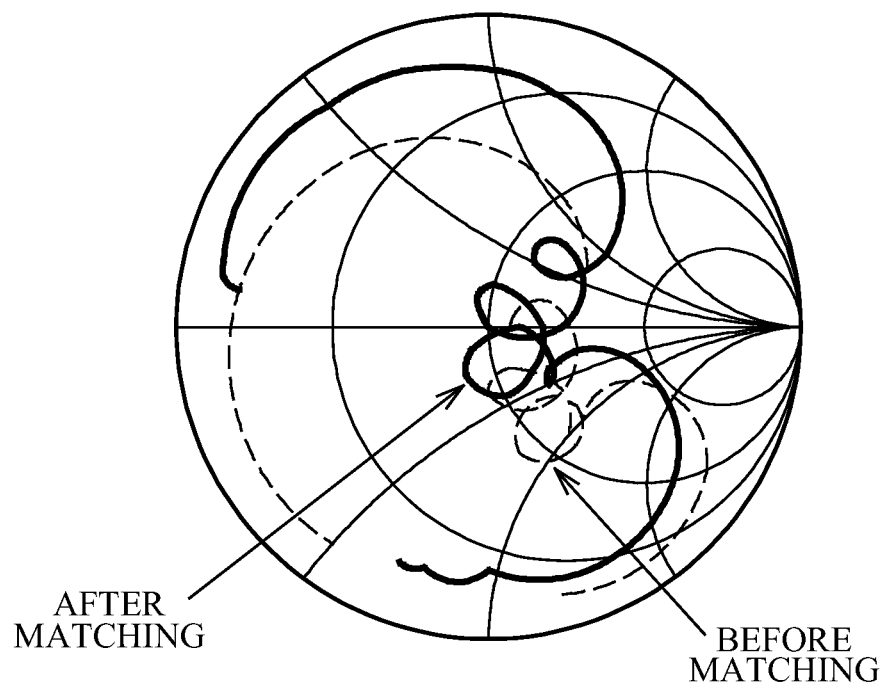
FIG. 3 is a graph comparing impedance characteristics between before and after matching in the reception filter circuit.

FIG. 3 is a graph comparing impedance characteristics between before and after matching in the reception filter circuit 14. In the following description, an impedance before matching is referred to as an "output impedance", and an impedance after matching is referred to as a "termination impedance". Referring to FIG. 1, the output impedance is an impedance of the reception filter circuit 14 viewed from a node between the reception filter circuit 14 and the matching circuit 20, and the termination impedance is an impedance of the matching circuit 20 viewed from the reception terminals (Rx1, Rx2). In FIG. 3, the matching circuit 20 performs matching so that an output impedance before matching of 150Ω is transformed to an output impedance after matching of 100Ω. At this point, an inductance of the inductor L1 at the antenna terminal side is 3.6 nH before and after matching.

The reception filter circuit 14 with a termination impedance of, for example, 100Ω is used. At this point, the filter characteristic of the reception filter circuit 14 can be changed by changing the value of the output impedance before matching or a configuration of the matching circuit 20 (matching method). Hereinafter, preferable values of the output impedance and the configuration of the matching circuit 20 will be examined.

Figure 4:
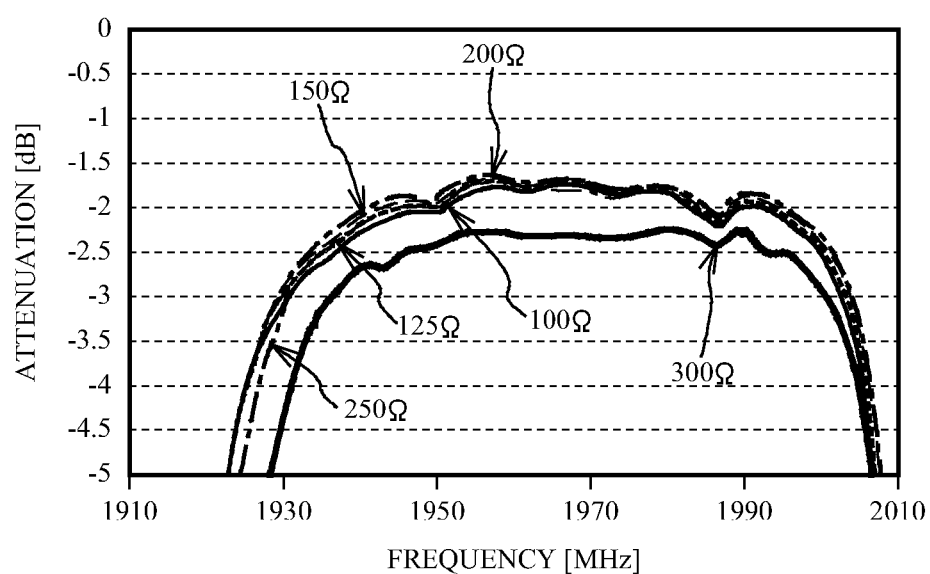
FIG. 4 is a graph comparing insertion loss characteristics at different output impedances in the reception filter circuit.
Figure 5:
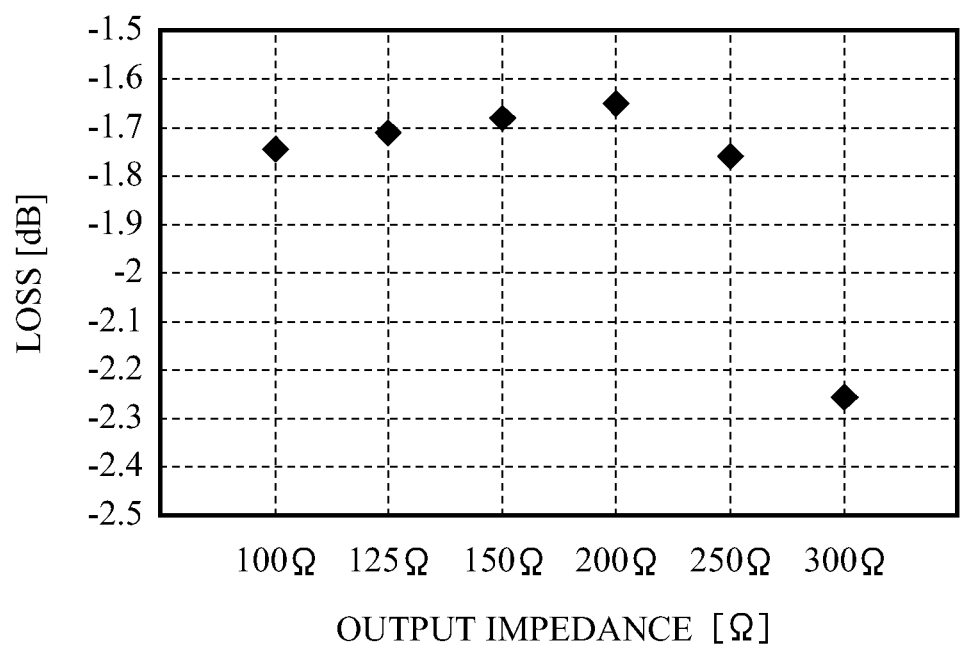
FIG. 5 is a graph illustrating a loss with respect to the output impedance in the reception filter circuit.
Figure 6:
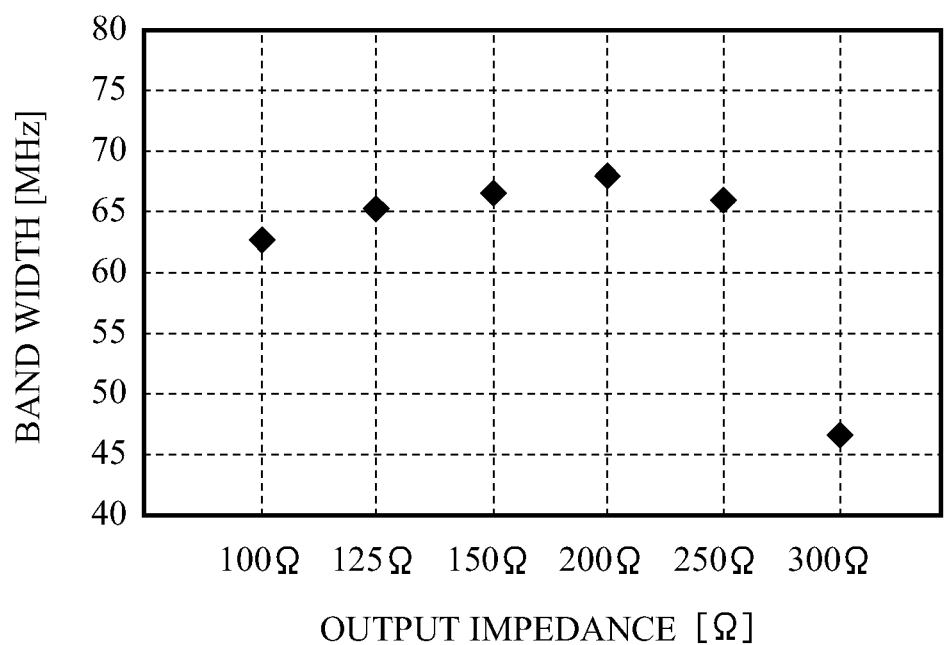
FIG. 6 is a graph illustrating a bandwidth with respect to the output impedance in the reception filter circuit.

FIG. 4 is a graph comparing insertion loss characteristics at different output impedances in the reception filter circuit 14. FIG. 5 is a graph that plots loss of the passband in the reception filter circuit 14, and FIG. 6 is a graph that plots a bandwidth (loss: −2.5 dB) of the reception filter circuit 14. In FIG. 4 through FIG. 6, the output impedance is changed from 100 to 300Ω under the assumption that the matching circuit 20 is not present (output impedance=termination impedance). As illustrated in FIG. 4 and FIG. 5, when the output impedance is between 125 and 200Ω, the insertion loss is improved compared to the insertion loss at 100Ω. Moreover, as illustrated in FIG. 4 and FIG. 6, when the output impedance is between 125 and 250Ω, the bandwidth is improved compared to the bandwidth at 100Ω. Therefore, the output impedance is preferably greater than or equal to 125Ω and less than or equal to 250Ω.

The output impedance in FIG. 4 through FIG. 6 changes depending on an aperture length of the IDT in the SAW filter (FIG. 2) constituting the reception filter circuit 14. When an impedance of a SAW filter is represented with Z and a capacitance of an electrode finger is represented with C, the equation $Z=1/j\omega C$ holds. Therefore, as the output impedance Z increases, the capacitance C decreases and the aperture length of the IDT decreases. In FIG. 4 through FIG. 6, when the output impedance is set to 100Ω, 125Ω, 150Ω, 200Ω, 250Ω, and 300Ω, the aperture length of the IDT in the DMS1 and DMS2 is 37λ, 33.5λ, 30λ, 23λ, 16λ, and 9λ, respectively. In the graphs illustrated in FIG. 4 through FIG. 6, when the output impedance is 300Ω, the filter characteristic greatly degrades, and this is considered due to the effect of loss by diffraction because the aperture length of the IDT decreases.

As described above, as the output impedance increases, the insertion loss and bandwidth of filter characteristics improve. Therefore, the output impedance of the reception filter circuit 14 is preferably configured to be greater than the termination impedance.

Figure 7:
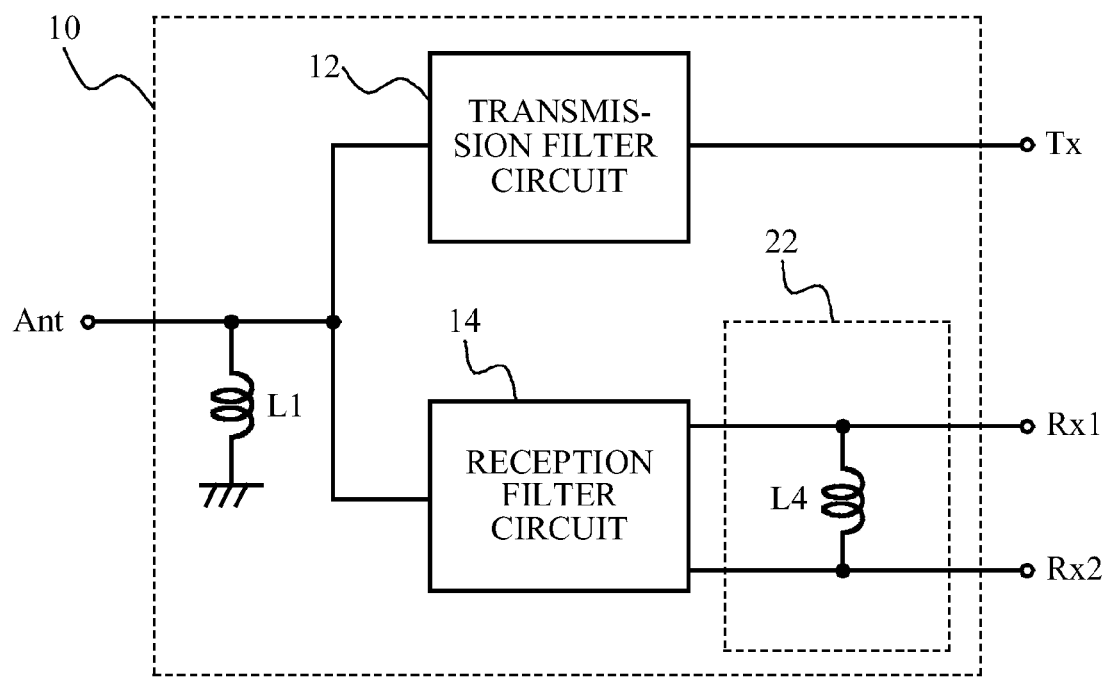
FIG. 7 is a diagram illustrating a configuration of a duplexer in accordance with a variation of the embodiment (No. 1)

FIG. 7 is a diagram illustrating a configuration of a duplexer in accordance with a first variation of the first embodiment. The first variation differs from the first embodiment (FIG. 1) in the configuration of a matching circuit 22, and other configurations thereof are the same. The first variation configures the matching circuit 22 to be formed by an inductor L4 connected between two balanced reception terminals (Rx1, Rx2), and thus separate inductors are not coupled to respective reception terminals.

Figure 8:
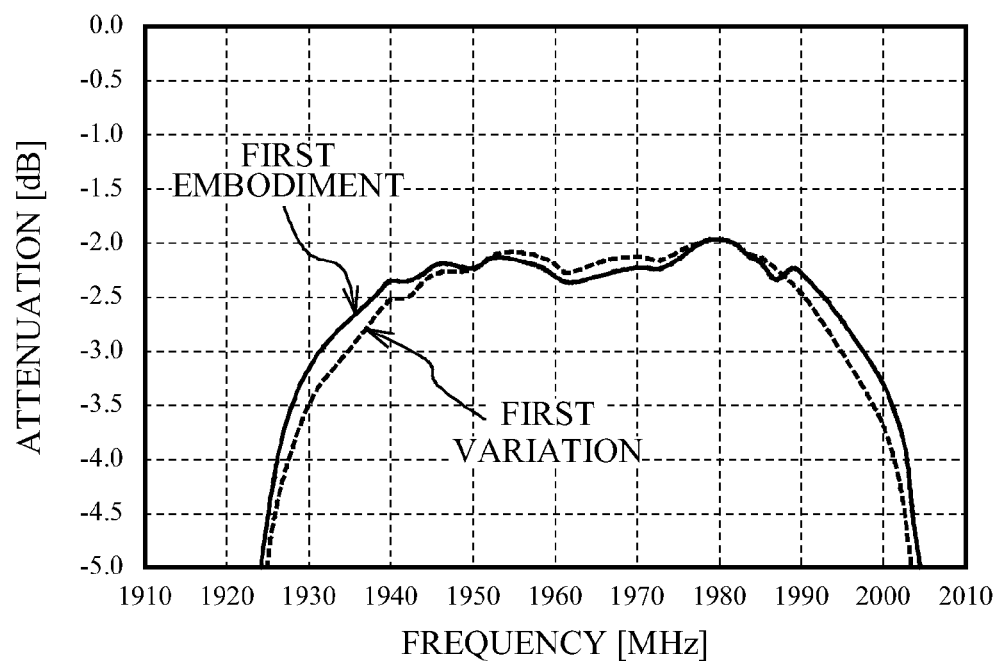
FIG. 8 is a graph comparing insertion loss characteristics of the reception filter circuits between the first embodiment and a first variation thereof.
Figure 9:
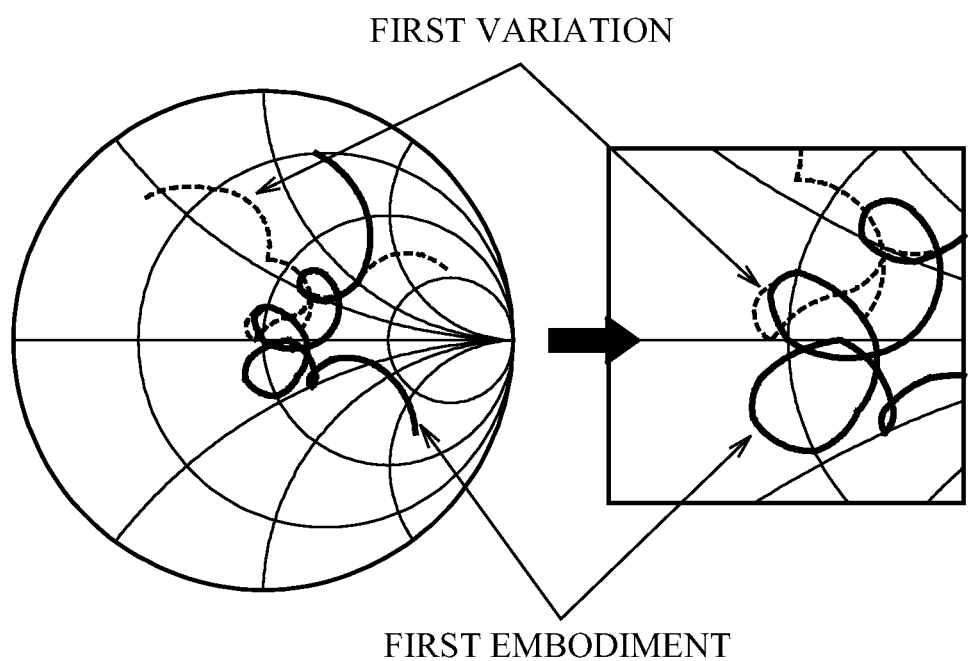
FIG. 9 is a graph comparing impedance characteristics of the reception filter circuits between the first embodiment and the first variation thereof.

FIG. 8 is a graph comparing insertion loss characteristics of the reception filter circuit 14 and the matching circuit between the first embodiment and the first variation thereof, and FIG. 9 is a graph comparing impedance characteristics between them. The first embodiment uses the matching circuit 20 in FIG. 1 as a matching circuit, and configures the output impedance to be 150Ω, and the termination impedance to be 100Ω. The first variation uses the matching circuit 22 in FIG. 7, and configures both the output impedance and the termination impedance to be 100Ω. The inductances of the inductors in the duplexer 10 are set as follows: L1=3.6 nH, L2=2.4 nH, L3=2.4 nH, L4=18 nH.

As illustrated in FIG. 9, the first variation can match with the termination impedance (100Ω) as same as the first embodiment. However, as illustrated in FIG. 8, the bandwidth of the first variation is narrower than that of the first embodiment. This is because the output impedance of the reception filter circuit 14 in the first variation is less than that of the first embodiment and thus the aperture length of the IDT is longer.

Figure 10:
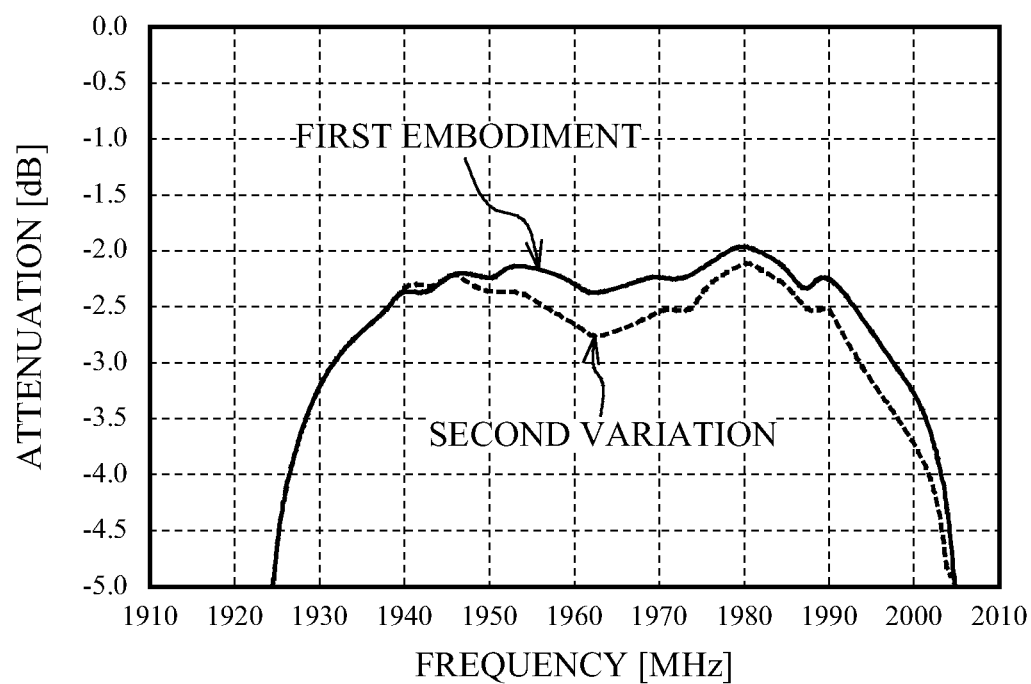
FIG. 10 is a graph comparing insertion loss characteristics of the reception filter circuits between the first embodiment and a second variation thereof.
Figure 11:
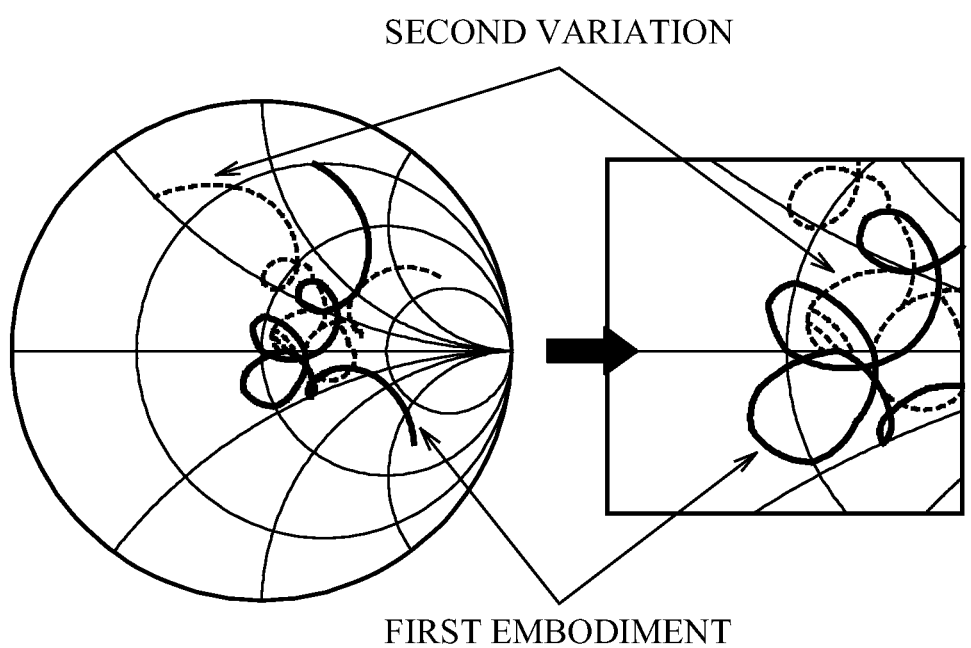
FIG. 11 is a graph comparing impedance characteristics of the reception filter circuits between the first embodiment and the second variation of the embodiment.

FIG. 10 is a graph comparing insertion loss characteristics of the reception filter circuit 14 and the matching circuit between the first embodiment and a second variation of the first embodiment, and FIG. 11 is a graph comparing impedance characteristics between them. The second variation uses the matching circuit 22 in FIG. 7 as a matching circuit, and configures the output impedance to be 150Ω, and the termination impedance to be 100Ω. As with the first variation, the inductances of the inductors of the duplexer 10 are set as follows: L1=3.6 nH, L2=2.4 nH, L3=2.4 nH, L4=18 nH.

As illustrated in FIG. 11, the termination impedance of the second variation is shifted higher than the termination impedance (100Ω) of the first embodiment. Thereby, as illustrated in FIG. 10, the bandwidth of the second variation is narrower than that of the first embodiment. This is because the first embodiment performs matching using the inductors (L2, L3) connected in series to the reception terminals (Rx1, Rx2) while the second variation performs matching using the inductor (L4) connected in parallel to them and fails in matching. Therefore, the inductors (L1, L2) connected in series to the reception terminals (Rx1, Rx2) respectively are preferably used in the matching circuit 20.

As described above, the duplexer 10 and the reception filter circuit 14 of the first embodiment make the value of impedance after matching (termination impedance) less than the impedance before matching (output impedance), and thereby can improve the filter characteristics. Moreover, when the reception filter circuit 14 includes the balanced terminals (Rx1, Rx2), filter characteristics can be further improved by configuring the matching circuit 20 to include the inductors (L2, L3) connected in series to respective balanced terminals.

The first embodiment configures the DMS portion 40 in the reception filter circuit 14 to have the configuration illustrated in FIG. 2, but the DMS portion 40 may have other configurations. Hereinafter, a description will be given of this respect.

Figure 12A:
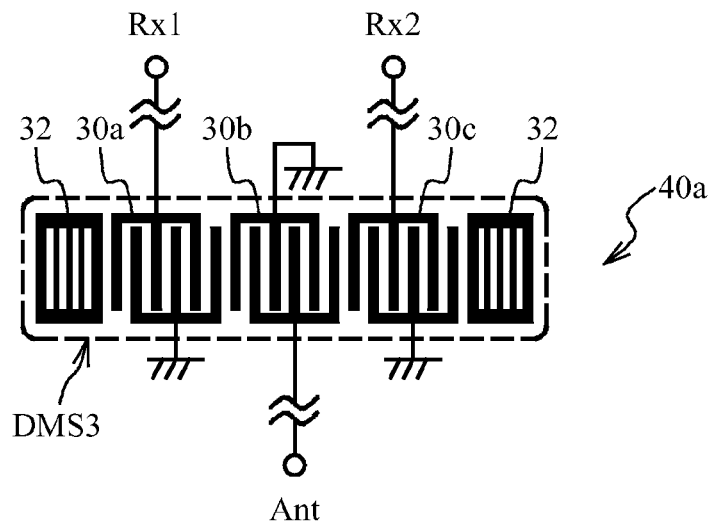
FIGS. 12A and 12B are diagrams illustrating a variation of a DMS portion (No. 1, No. 2)

FIG. 12A is a diagram illustrating a variation of the DMS portion (No. 1). A DMS portion 40a is composed of a DMS3 that is a double mode SAW filter including three IDTs. In the DMS 3, three IDTs 30a through 30c are arranged in the propagation direction of the surface acoustic wave, and the reflection electrodes 32 are located at both sides thereof. The IDT 30b at the center is coupled to the antenna terminal Ant, the IDT 30a is coupled to the reception terminal Rx1, and the IDT 30c is coupled to the reception terminal Rx2.

When the DMSs (DMS1, DMS2) of the DMS portion 40 in FIG. 2 have capacitances of Cp and are replaced with the DMS3 in FIG. 12A, the capacitance (Cs) of the DMS3 is expressed with Cs=2Cp. Thus, when the output impedance is 150Ω and the DMS1 and DMS2 have an aperture length of 30λ, the aperture length of the DMS3 becomes 60λ that is twice as long as those of the DMS1 and DMS2, and the electrode finger resistance increases. Therefore, the DMS portion 40 of the first embodiment can have the configuration illustrated in FIG. 12A, but preferably has the configuration illustrated in FIG. 2 to reduce the electrode finger resistance.

Figure 12B:
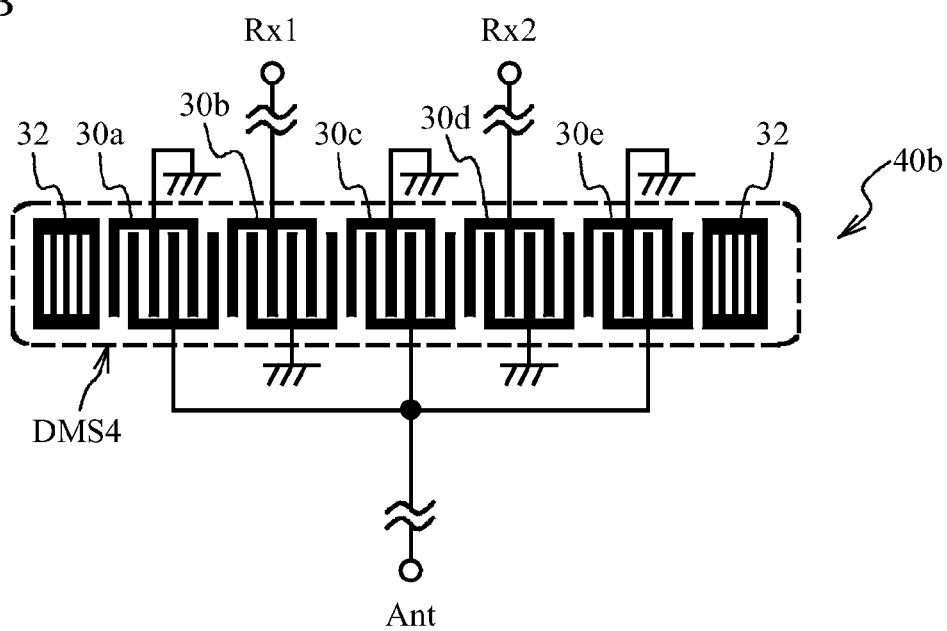

FIG. 12B is a diagram illustrating a variation of the DMS portion (No. 2). A DMS portion 40b is composed of a DMS4 that is a double mode SAW filter including five IDTs. In the DMS4, five IDTs 30a through 30e are arranged in the propagation direction of the surface acoustic wave, and the reflection electrodes 32 are located at both sides thereof. The IDT 30c at the center and the IDTs 30a and 30e at both sides are commonly coupled to the antenna terminal Ant, the IDT 30b is coupled to the reception terminal Rx1, and the IDT 30d is coupled to the reception terminal Rx2. The above described configuration can also improve the filter characteristics as with the first embodiment.

Figure 13:
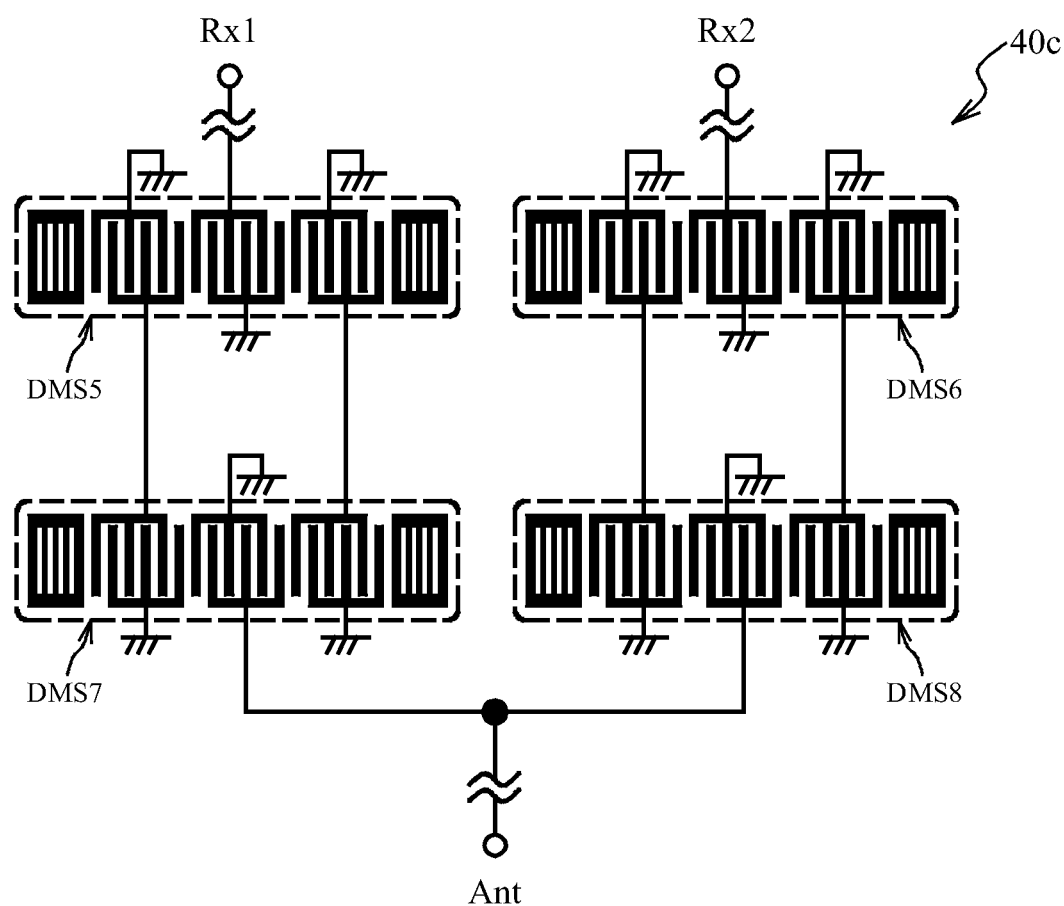
FIG. 13 is a diagram illustrating a variation of the DMS portion (No. 3)

FIG. 13 is a diagram illustrating a variation of the DMS portion (No. 3). A DMS portion 40c has a configuration in which the DMS1 and DMS2 in FIG. 2 are cascade-connected. That is to say, a DMS5 and a DMS7 are connected in series between the reception terminal Rx1 and the antenna terminal Ant, and a DMS6 and a DMS8 are connected in series between the reception terminal Rx2 and the antenna terminal Ant. The DMS5 through DMS8 are double mode SAW filters, each including three IDTs. The above described configuration can also improve the filter characteristics as with the first embodiment.

The first embodiment configures both the inductances of the inductors L2 and L3 in the matching circuit 20 to be 2.4 nH, but these inductors may have different inductances.

Figure 14:
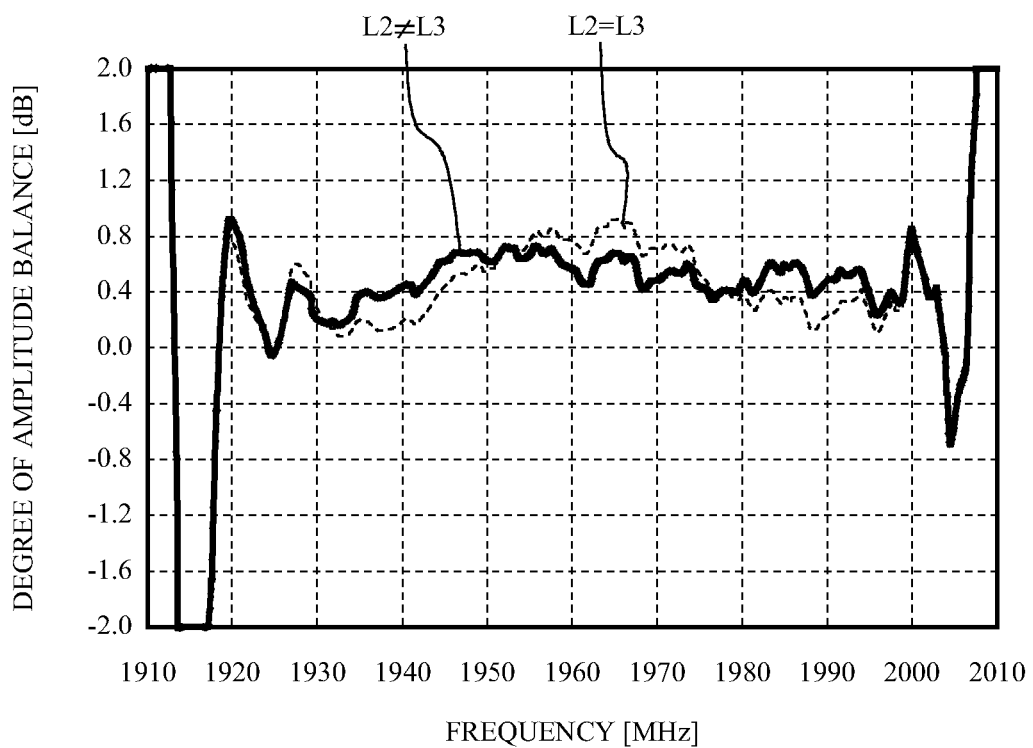
FIG. 14 is a graph comparing balance characteristics between different inductances of the inductors in the matching circuit.

FIG. 14 is a graph comparing balance characteristics between different inductances in the matching circuit 20. A dotted line in the graph indicates a case of L2=L3 as described in the first embodiment, and a solid line in the graph indicates a case of L2≠L3 (L2=2.0 nH, L3=2.4 nH). As illustrated, the balance characteristic indicated by the solid line is improved compared to that indicated by the dotted line. As described above, when the two inductors (L2, L3) are connected in series to the reception terminals (Rx1, Rx2) with a balanced terminal as the matching circuit 20, the balance characteristics can be improved by arbitrarily adjusting the inductances of the inductors.

The first embodiment arranges the matching circuit 20 between the reception filter circuit 14 and the reception terminal (Rx1, Rx2), but the filter characteristics can be improved as with the first embodiment even when the matching circuit 20 is arranged in other locations.

Figure 15:
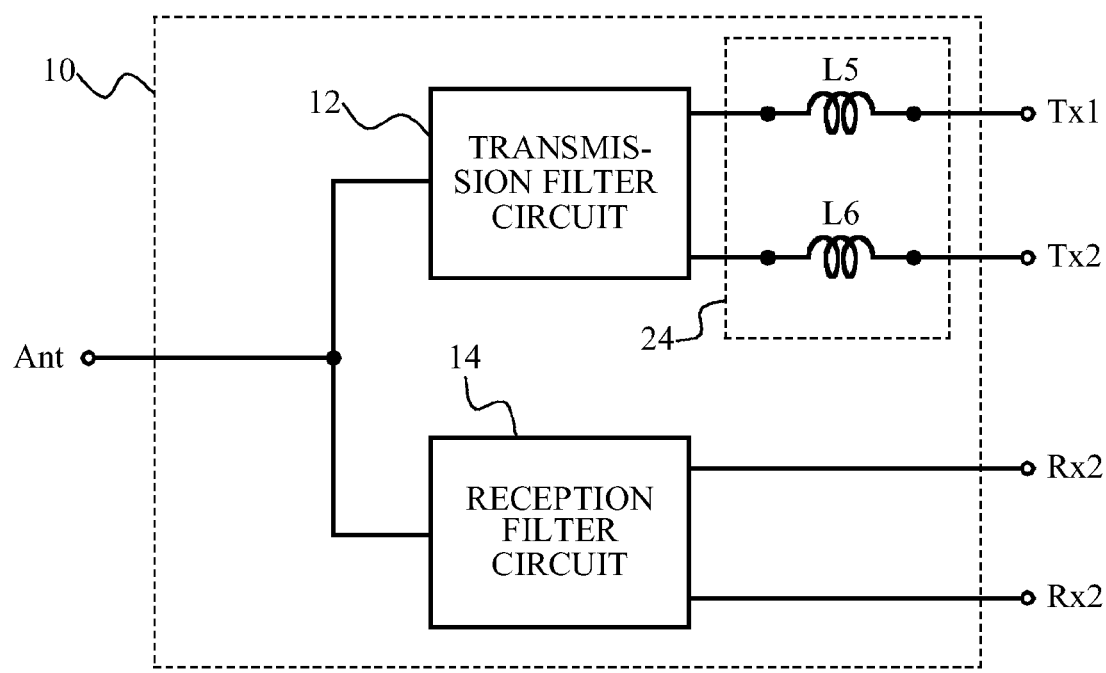
FIG. 15 is a diagram illustrating a configuration of a duplexer in accordance with a variation of the embodiment (No. 2)

FIG. 15 is a diagram illustrating a configuration of a duplexer in accordance with a variation of the embodiment (No. 2). The duplexer 10 includes two transmission terminals (Tx1, Tx2), and a matching circuit 24 is connected between the transmission filter circuit 12 and the transmission terminals. The matching circuit 24 is configured so that the inductors (L5, L6) are connected in series to the transmission terminals (Tx1, Tx2) respectively as with FIG. 1. The transmission filter circuit 12 is configured so that SAW filters including a double-mode filter are arranged in a ladder form as with the reception filter circuit 14 in FIG. 2. In the description hereinafter, an impedance of the transmission filter circuit 12 viewed from a node between the transmission filter circuit 12 and the matching circuit 24 is referred to as an "input impedance", and an impedance of the matching circuit 24 from the reception terminals (Rx1, Rx2) is referred to as a "termination impedance".

The aperture length of the IDT constituting the SAW filter in the transmission filter circuit 12 can also be reduced by making the "input impedance" before matching greater than the "termination impedance" after matching in the duplexer illustrated in FIG. 15. Thereby, the insertion loss and bandwidth of the filter are expected to be improved as illustrated in FIG. 5 and FIG. 6.

Figure 16:
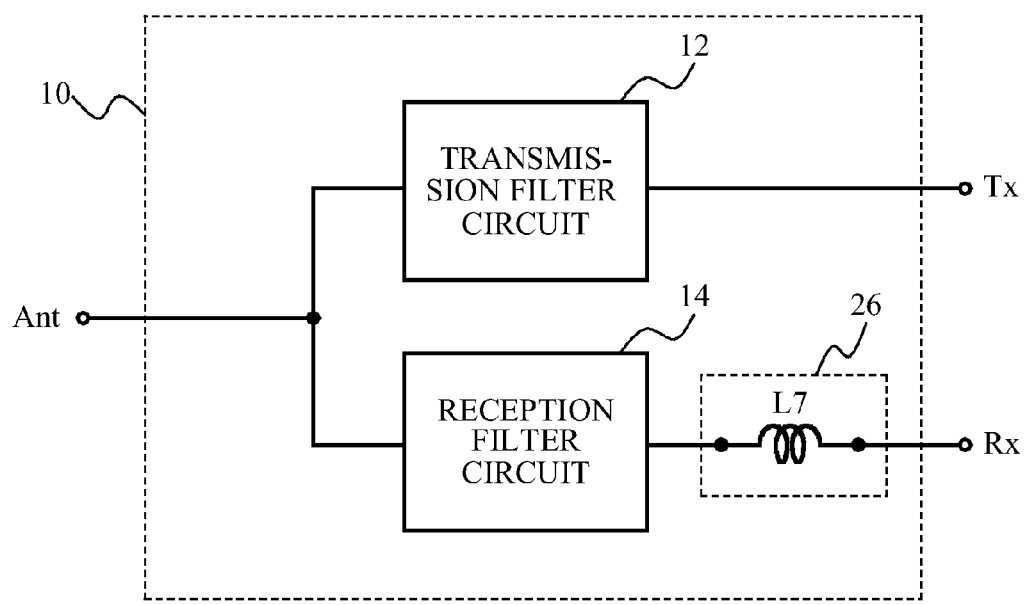
FIG. 16 is a diagram illustrating a configuration of a duplexer in accordance with a variation of the embodiment (No. 3).

FIG. 16 is a diagram illustrating a configuration of a duplexer in accordance with a variation of the embodiment (No. 3). The duplexer 10 differs from previously described embodiment and variations in that it includes only one reception terminal (unbalanced terminal) Rx. A matching circuit 26 is located between the reception filter circuit 14 and the reception terminal Rx. The matching circuit 26 includes an inductor L7 connected in series to the reception terminal Rx as with the first embodiment.

The aperture length of the IDT constituting the SAW filter in the reception filter circuit 14 can also be reduced by making the "output impedance" before matching greater than the "termination impedance" after matching in the duplexer illustrated in FIG. 16. Thereby, the insertion loss and bandwidth of the filter are expected to be improved as illustrated in FIG. 5 and FIG. 6.

The matching circuit 26 in FIG. 16 may be located at a side of the transmission filter circuit 12. In addition, the first embodiment and the variations thereof arrange the matching circuit at one of the reception side and transmission side. However, it is sufficient if the matching circuit is located at least one of between the transmission filter circuit 12 and the transmission terminal Tx and between the reception filter circuit 14 and the reception terminal Rx, and the matching circuit may be located at both.

Moreover, the first embodiment and variations thereof use an acoustic wave device using a surface acoustic wave (SAW) as the acoustic wave device constituting the resonator or the DMS, but may use an acoustic wave device using a Love wave or a boundary acoustic wave as a filter including an IDT.

Although the embodiments of the present invention have been described in detail, it is to be understood that the various change, substitutions, and alterations could be made hereto without departing from the spirit and scope of the invention.

What is claimed is:

1. A filter comprising:
a filter circuit connected between a first terminal and two second balanced terminals and including a first DMS filter and a second DMS filter, one terminal of the first DMS filter being connected to one of the two second balanced terminals, and one terminal of the second DMS filter is connected to another of the two second balanced terminals; and a matching circuit including a first inductor and a second inductor, the first inductor being connected in series between the one terminal of the first DMS filter and the one of the two second balanced terminals, and the second inductor being connected in series between the one terminal of the second DMS filter and the another of the two second balanced terminals, wherein a first impedance viewed from the one of the two second balanced terminals toward the matching circuit is less than a second impedance viewed from a node between the one terminal of the first DMS filter and the one of the two second balanced terminals toward the filter circuit, and a third impedance viewed from the another of the two second balanced terminals toward the matching circuit is less than a fourth impedance viewed from a node between the one terminal of the second DMS filter and the another of the two second balanced terminals toward the filter circuit.

2. The filter according to claim 1, wherein the first inductor and the second inductor have different inductances.

3. The filter according to claim 1, wherein
the first terminal is an antenna terminal,
the two second balanced terminals are reception terminals, and
the second impedance and the fourth impedance are output impedances of the filter circuit.

4. The filter according to claim 1, wherein
the first terminal is an antenna terminal,
the two second balanced terminals are transmission terminals, and
the second impedance and the fourth impedance are input impedances of the filter circuit.

5. The filter according to claim 1, wherein
each of the first impedance and the third impedance is 100Ω,
each of the second impedance and the fourth impedance is greater than or equal to 125Ω and less than or equal to 250Ω.

6. A duplexer comprising:
a filter according to claim 1.

7. The filter according to claim 1, wherein the filter circuit includes a first resonator connected in series between the one terminal of the first DMS filter and the first inductor and a second resonator connected in series between the one terminal of the second DMS filter and the second inductor.

8. The filter according to claim 1, wherein no pass is connected between the one of the two second balanced terminals and the another of the two second balanced terminals in the matching circuit.

* * * * *